United States Patent
Lee et al.

(10) Patent No.: US 10,824,076 B2
(45) Date of Patent: Nov. 3, 2020

(54) RANDOM COPOLYMER FOR FORMING NEUTRAL LAYER, LAMINATE FOR FORMING PATTERN INCLUDING THE SAME, AND METHOD FOR FORMING PATTERN USING THE SAME

(71) Applicant: SK Innovation Co., Ltd., Seoul (KR)

(72) Inventors: Nam Kyu Lee, Daejeon (KR); Sun Young Kim, Daejeon (KR); Kwang Kuk Lee, Daejeon (KR); Jin Su Ham, Daejeon (KR)

(73) Assignee: SK Innovation Co., Ltd., Seoul (KR)

( * ) Notice: Subject to any disclaimer, the term of this patent is extended or adjusted under 35 U.S.C. 154(b) by 13 days.

(21) Appl. No.: 16/106,444

(22) Filed: Aug. 21, 2018

(65) Prior Publication Data
US 2019/0064670 A1 Feb. 28, 2019

(30) Foreign Application Priority Data
Aug. 22, 2017 (KR) .................. 10-2017-0105964

(51) Int. Cl.
| | | |
|---|---|---|
| *C08F 220/14* | (2006.01) | |
| *C08F 220/36* | (2006.01) | |
| *G03F 7/20* | (2006.01) | |
| *C09D 125/16* | (2006.01) | |
| *C08F 212/14* | (2006.01) | |
| *C09D 125/14* | (2006.01) | |
| *C08F 212/32* | (2006.01) | |
| *C09D 133/14* | (2006.01) | |
| *C09D 133/12* | (2006.01) | |
| *G03F 7/00* | (2006.01) | |
| *C08F 212/08* | (2006.01) | |

(52) U.S. Cl.
CPC .......... *G03F 7/2037* (2013.01); *C08F 212/14* (2013.01); *C08F 212/32* (2013.01); *C08F 220/14* (2013.01); *C09D 125/14* (2013.01); *C09D 125/16* (2013.01); *C09D 133/12* (2013.01); *C09D 133/14* (2013.01); *G03F 7/0002* (2013.01); *C08F 212/08* (2013.01)

(58) Field of Classification Search
None
See application file for complete search history.

(56) References Cited

U.S. PATENT DOCUMENTS

| | | | | |
|---|---|---|---|---|
| 5,116,930 | A * | 5/1992 | Yabuta | C08G 18/3271 525/328.2 |
| 6,117,961 | A * | 9/2000 | Ogawa | C08F 212/08 526/347 |
| 6,235,843 | B1 * | 5/2001 | Eck | C08F 212/14 428/425.1 |
| 9,093,263 | B2 | 7/2015 | Wu et al. | |
| 9,181,449 | B2 | 11/2015 | Yi et al. | |
| 9,556,353 | B2 | 1/2017 | Cheng et al. | |
| 10,000,664 | B2 | 6/2018 | Wakayama et al. | |
| 10,532,546 | B2 | 1/2020 | Park et al. | |

FOREIGN PATENT DOCUMENTS

| | | | |
|---|---|---|---|
| JP | 62275167 | * | 11/1987 |
| JP | 2010132869 | * | 6/2010 |
| KR | 1020140138881 A | | 12/2014 |
| KR | 1020160061971 A | | 6/2016 |
| KR | 1020160095137 A | | 8/2016 |
| KR | 1020160143579 A | | 12/2016 |

* cited by examiner

*Primary Examiner* — David J Buttner
(74) *Attorney, Agent, or Firm* — The Webb Law Firm (57) ABSTRACT

The present invention provides a random copolymer including structural units represented by the following Chemical Formulae 1 to 3

[Chemical Formula 1]

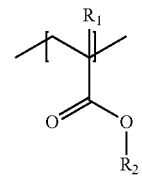

[Chemical Formula 2]

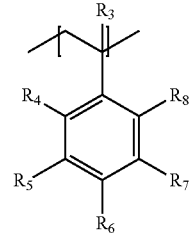

[Chemical Formula 3]

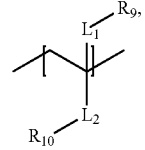

for forming a neutral layer for significantly reducing process time and process costs, and promoting directed self-assembly pattern formation of a block copolymer. The present invention further provides a laminate for forming a pattern including a neutral layer having a small thickness variation value due to washing, by including the random copolymer for forming a neutral layer. The present invention further provides a method for forming a pattern capable of stably vertically orienting a block copolymer on a laminate for forming a neutralized pattern.

10 Claims, 1 Drawing Sheet

RANDOM COPOLYMER FOR FORMING NEUTRAL LAYER, LAMINATE FOR FORMING PATTERN INCLUDING THE SAME, AND METHOD FOR FORMING PATTERN USING THE SAME

CROSS-REFERENCE TO RELATED APPLICATION

This application claims priority to Korean Patent Application No. 10-2017-0105964 filed Aug. 22, 2017, the disclosure of which is hereby incorporated in its entirety by reference.

TECHNICAL FIELD

The following disclosure relates to pattern formation technology by directed self-assembly, and more particularly, to a random copolymer for forming a neutral layer promoting directed self-assembly pattern formation, a laminate for forming a pattern including the same, and a method for forming a high-quality pattern using the same.

BACKGROUND

As a semiconductor device is miniaturized and integrated, the fineness of the circuit pattern is required. For this, a method of improving light exposure equipment, or improving a pattern formation method has been studied. Among them, in the case of improving light exposure equipment, initial investment costs occur, and the usage of the conventional equipment is lowered, and thus, studies on improvement of the method for forming a pattern have received attention.

An improved method for forming a pattern includes a method for forming a directed self-assembly (DSA) pattern using self-aligning of a block copolymer (BCP). It is expected that a resist pattern having a line width of 20 nm or less which is difficult to be implemented by an optical method for forming a pattern may be implemented, by the method for forming a directed self-assembly pattern.

The method for forming a directed self-assembly pattern is to graft an orientation characteristic of a block copolymer on the existing method for forming a photoresist pattern, so that the block copolymer is oriented in a constant direction, thereby forming a micronized resist pattern. Specifically, in a process for forming a directed self-assembly pattern, a predetermined photoresist pattern or guide pattern is formed on a substrate such as wafer and ITO glass substrate, using the existing ArF, KrF or I-line photoresist composition, and then a block copolymer is coated on a space region between the photoresist patterns, and heated, thereby forming a block copolymer-coated film. Next, the coated film is heated to a glass transition temperature ($T_g$) of the block copolymer or higher, thereby rearranging, self-aligning or self-orienting the block copolymer, and the rearranged block copolymer is partially removed, thereby obtaining a self-aligned resist pattern having a predetermined regularity.

In order to form a fine pattern by rearrangement as such, generally a neutral layer should be formed as a lower layer of the block copolymer. Since a silicon wafer, ITO glass and the like used in a semiconductor or LCD process have different polarities depending on the materials, they interfere with the self-arrangement of the block copolymer which is arranged depending on the polarity, thereby making the formation of patterns difficult. For example, when the lower film of the block copolymer is formed of a nonpolar material, the nonpolar portion of the block copolymer is positioned adjacent to the lower film, and when the lower film is formed of a polar material, the polar portion of BCP is positioned adjacent to the lower film. As a result, the desired lamellar structure pattern in vertical orientation is not formed, then a lamellar structure in horizontal orientation is formed. Accordingly, it is necessary to form a neutral layer on the lower portion of BCP in order to form a lamellar structure pattern by vertically orienting the block copolymer.

As the neutral layer-forming material as such, a hydroxy terminated random copolymer, a benzocyclobutene (BCB)-based crosslinkable random copolymer and the like have been suggested.

However, the hydroxy terminated random copolymer has an unduly long pattern formation process time, which is about three days for a heat treatment time required for a neutral layer formation process. A benzocyclobutene-based crosslinkable random copolymer is synthesized by a complicated process, and has high process costs.

Thus, there is required a study on the material for forming a neutral layer which may improve process costs and process efficiency, by reduced process time and raw material costs.

SUMMARY

An embodiment of the present invention is directed to providing a random copolymer for forming a neutral layer for significantly reducing process time and process costs, and promoting directed self-assembly pattern formation of a block copolymer.

An embodiment of the present invention is directed to providing a laminate for forming a pattern including a neutral layer having a small thickness variation value due to washing, by including the random copolymer for forming a neutral layer.

An embodiment of the present invention is directed to providing a method for forming a pattern capable of stably vertically orienting a block copolymer on a laminate for forming a neutralized pattern.

In one general aspect, a random copolymer for forming a neutral layer includes structural units represented by the following Chemical Formulae 1 to 3:

[Chemical Formula 1]

[Chemical Formula 2]

[Chemical Formula 3]

wherein $R_1$ to $R_8$ are independently of one another hydrogen, halogen or a $C_1$ to $C_{10}$ hydrocarbyl group, $L_1$ and $L_2$ are a linking group, and independently of each other a direct bond, —C(=O)—O—, a $C_1$ to $C_{20}$ hydrocarbylene group, or a $C_1$ to $C_{20}$ halocarbylene group, $R_9$ and $R_{10}$ are independently of each other hydrogen, halogen, a $C_1$ to $C_{10}$ hydrocarbyl group, —NCO or -$L_3$—NCO, any one of $R_9$ and $R_{10}$ is —NCO or -$L_3$—NCO, $L_3$ is a $C_1$ to $C_{10}$ hydrocarbylene group, and Chemical Formulae 1 to 3 which are each randomly arranged structural units have mole fractions defined as m, n and l, respectively in this order, and m, n and l are rational numbers satisfying 0.2<m<0.9, 0.2<n<0.9, and 0<l<0.4, respectively, based on total mole fractions of the structural units.

For the random copolymer according to an exemplary embodiment of the present invention, in Chemical Formulae 1 to 3, $R_1$ to $R_8$ may be independently of one another hydrogen, halogen or a $C_1$ to $C_{10}$ alkyl group, $L_1$ and $L_2$ may be a linking group, and independently of each other a direct bond, —C(=O)—O—, a $C_1$ to $C_{10}$ alkylene group, $C_6$ to $C_{20}$ arylene group or a $C_6$ to $C_{20}$ haloarylene group, $R_9$ and $R_{10}$ may be independently of each other hydrogen, halogen, a $C_1$ to $C_{10}$ alkyl group, —NCO or -$L_3$—NCO, any one of $R_9$ and $R_{10}$ may be —NCO or -$L_3$—NCO, and $L_3$ may be a $C_1$ to $C_{10}$ alkylene group.

For the random copolymer according to an exemplary embodiment of the present invention, in Chemical Formula 3, $L_1$ may be a direct bond as the linking group, and $L_2$ may be —C(=O)—O— as the linking group, and $R_9$ may be hydrogen or a $C_1$ to $C_{10}$ alkyl group, $R_{10}$ may be —NCO or -$L_3$—NCO, and $L_3$ may be $C_1$ to $C_{10}$ alkylene group.

For the random copolymer according to an exemplary embodiment of the present invention, in Chemical Formula 3, $L_1$ may be a direct bond as the linking group, and $L_2$ may be a $C_6$ to $C_{20}$ arylene group as the linking group, and $R_9$ may be hydrogen or a $C_1$ to $C_{10}$ alkyl group, $R_{10}$ may be —NCO or -$L_3$—NCO, and $L_3$ may be $C_1$ to $C_{10}$ alkylene group.

For the random copolymer according to an exemplary embodiment of the present invention, in Chemical Formulae 1 and 2, $R_1$ and $R_3$ may be independently of each other hydrogen or a $C_1$ to $C_{10}$ alkyl group, $R_2$ may be a $C_1$ to $C_{10}$ alkyl group, and $R_4$ to $R_8$ may be independently of one another hydrogen or halogen.

For the random copolymer according to an exemplary embodiment of the present invention, in Chemical Formula 3, $L_1$ may be a direct bond as the linking group, and $L_2$ may be —C(=O)—O— as the linking group, and $R_9$ may be hydrogen or a $C_1$ to $C_5$ alkyl group, $R_{10}$ may be —NCO or -$L_3$—NCO, and $L_3$ may be $C_1$ to $C_5$ alkylene group.

For the random copolymer according to an exemplary embodiment of the present invention, in Chemical Formula 3, $L_1$ may be a direct bond as the linking group, and $L_2$ may be a $C_6$ to $C_{15}$ arylene group as the linking group, and $R_9$ may be hydrogen or a $C_1$ to $C_5$ alkyl group, $R_{10}$ may be —NCO or -$L_3$—NCO, and $L_3$ may be $C_1$ to $C_5$ alkylene group.

For the random copolymer according to an exemplary embodiment of the present invention, in Chemical Formulae 1 and 2, $R_1$ and $R_3$ may be independently of each other hydrogen or a $C_1$ to $C_5$ alkyl group, $R_2$ may be a $C_1$ to $C_5$ alkyl group, and $R_4$ to $R_8$ may be independently of one another hydrogen or halogen.

The random copolymer according to an exemplary embodiment of the present invention may include 0.1 to 20 mol % of a monomer of the structural unit represented by Chemical Formula 3, based on total 100 mol % of the monomers forming the random copolymer.

The random copolymer according to an exemplary embodiment of the present invention may have a number average molecular weight of 1,000 to 500,000 g/mol, and a polydispersity index of 1.0 to 2.0.

The laminate for forming a pattern according to an exemplary embodiment of the present invention may be formed on the substrate, and include a neutral layer including the random copolymer as described above.

The neutral layer according to an exemplary embodiment of the present invention may have a thickness variation value due to washing, satisfying the following Equation 1:

$$\left|\frac{T_0 - T_1}{T_0}\right| < 0.08 \quad \text{[Equation 1]}$$

wherein $T_0$ is a thickness of the neutral layer before washing, and $T_1$ is a thickness of the neutral layer after washing.

The method for forming a pattern according to an exemplary embodiment of the present invention may use the random copolymer as described above with a block copolymer.

The method for forming a pattern according to an exemplary embodiment of the present invention may include: a) applying a random copolymer solution including the random copolymer on a substrate, b) subjecting the applied random copolymer solution to heat treatment to form a neutral layer, c) applying a block copolymer solution including the block copolymer on the neutral layer, and d) subjecting the applied block copolymer solution to heat treatment to form a pattern.

According to an exemplary embodiment, in step a), the random copolymer solution may have a concentration of 0.1 to 5 wt %.

According to an exemplary embodiment, in step b), the heat treatment may be performed at 230 to 300° C.

According to an exemplary embodiment, in step b), the formed neutral layer may have a thickness variation value due to washing, satisfying the following Equation 1:

$$\left|\frac{T_0 - T_1}{T_0}\right| < 0.08 \quad \text{[Equation 1]}$$

wherein $T_0$ is a thickness of the neutral layer before washing, and $T_1$ is a thickness of the neutral layer after washing.

According to an exemplary embodiment of the present invention, after heat treatment in step d), a step of partially etching the block copolymer may be further included.

Other features and aspects will be apparent from the following detailed description, the drawings, and the claims.

BRIEF DESCRIPTION OF THE DRAWINGS

In FIG. 1(a) is a pattern formed by PS-b-PMMA, and FIG. 1(b) is a pattern formed by (PS-r-P4FS)-b-PMMA.

DETAILED DESCRIPTION OF EMBODIMENTS

The advantages, features and aspects of the present invention will become apparent from the following description of the embodiments with reference to the accompanying drawings, which is set forth hereinafter. The present invention may, however, be embodied in different forms and should not be construed as limited to the embodiments set forth herein. Rather, these embodiments are provided so that this disclosure will be thorough and complete, and will fully convey the scope of the present invention to those skilled in the art. The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Hereinafter, the present invention will be described in more detail with reference to the exemplary embodiments and Examples including the accompanying drawings. However, the following exemplary embodiments and Examples are only a reference for describing the present invention in detail, and the present invention is not limited thereto, and may be implemented in various forms.

In addition, unless otherwise defined, all technical terms and scientific terms have the same meanings as those commonly understood by a person skilled in the art to which the present invention pertains, the terms used herein is only for effectively describing a certain exemplary embodiment, and not intended to limit the present invention.

In addition, the singular form used in the specification and claims appended thereto may be intended to also include a plural form, unless otherwise indicated in the context.

In the present invention, "hydrocarbyl" refers to a radical having one bonding site derived from hydrocarbon, and specifically, for example, may be selected from alkyl, cycloalkyl, aryl, alkenyl, alkynyl, and the like, or a combination thereof. "hydrocarbylene" refers to a hydrocarbon divalent radical having two bonding sites derived from hydrocarbon.

An "alkyl group" described in the present invention includes both a straight chain or a branched chain form, and an "aryl group" refers to an organic radical derived from aromatic hydrocarbon by removal of one hydrogen, including a monocyclic or fused ring system containing suitably 4 to 7, preferably 5 or 6 ring atoms in each ring, and even a form in which a plurality of aryls is linked by a single bond. The specific example of the aryl group includes an aromatic group such as phenyl, naphthyl, biphenyl, indenyl, fluorenyl, phenanthrenyl, anthracenyl, triphenylenyl, pyrenyl, crysenyl and naphthacenyl, but not limited thereto. An "alkylene group" is an organic radical derived from hydrocarbon by removal of two hydrogens. An "arylene group" is an organic radical derived from aromatic hydrocarbon by removal of two hydrogens.

A "halocarbylene group" in the present invention refers to hydrocarbylene in which all hydrogens are substituted by fluorine (F), chlorine (Cl), bromine (Br) or iodine (I).

A "haloarylene group" in the present invention refers to arylene in which all hydrogens are substituted by fluorine (F), chlorine (Cl), bromine (Br) or iodine (I).

An "organic solvent" in the present invention is classified into a solvent used in polymerization, a solvent dissolving a polymerized product, and a solvent dissolving a block or random copolymer, and all are not particularly limited to any kind. That is, the organic solvent capable of dissolving a polymer may be used without limitation, but it is preferred to use specifically exemplified ones, and the solvents may be identical or different.

Hereinafter, the present invention will be described in more detail.

The inventors of the present invention found out that in the random copolymer including the structural units represented by the following Chemical Formulae 1 to 3, when the random copolymer includes the structural unit represented by the following Chemical Formula 3, a neutral layer having a high degree of crosslinking may be formed within a short time, and thus, a pattern formation process time, and process costs may be significantly reduced, and a stably vertical orientation-directed self-assembly (DSA) pattern may be formed using self-alignment of a block copolymer on the neutral layer, thereby completing the present invention. Thus, the neutral layer on the substrate may have a small thickness variation value due to washing even in the case of short-time heat treatment, by an isocyanate group (—NCO) included in structural unit represented by the following Chemical Formula 3. In addition, it was found out that damage to the neutral layer may be prevented by a follow-up process, and a vertically oriented, high-quality pattern may be stably formed, and thus, the present invention has been completed.

The present invention may provide a random copolymer for forming a neutral layer including structural units represented by the following Chemical Formulae 1 to 3:

[Chemical Formula 1]

[Chemical Formula 2]

[Chemical Formula 3]

wherein $R_1$ to $R_8$ are independently of one another hydrogen, halogen or a $C_1$ to $C_{10}$ hydrocarbyl group, $L_1$ and $L_2$ are a linking group, and independently of each other a direct bond, —C(=O)—O—, a $C_1$ to $C_{20}$ hydrocarbylene group, or a $C_1$ to $C_{20}$ halocarbylene group, $R_9$ and $R_{10}$ are independently of each other hydrogen, halogen, a $C_1$ to $C_{10}$ hydrocarbyl group, —NCO or -$L_3$—NCO, any one of $R_9$ and $R_{10}$ is —NCO or -$L_3$—NCO, $L_3$ is a $C_1$ to $C_{10}$ hydrocarbylene group, and Chemical Formulae 1 to 3 which are each randomly arranged structural units have mole fractions defined as m, n and l, respectively in this order, and m, n and l are rational numbers satisfying $0.2<m<0.9$, $0.2<n<0.9$, and $0<l<0.4$, respectively, based on total mole fractions of the structural units.

The neutral layer including the random copolymer for forming a neutral layer of the present invention is provided, thereby having a small thickness variation value even with washing, and thus, the neutral layer is not affected by a follow-up process, and a lamellar phase in which the block copolymers vertically oriented may be stably formed on the neutral layer.

Preferably, in order to form a neutral layer having a stable and high degree of crosslinking even in the case of a heat treatment process time being shortened, the random copolymer according to an exemplary embodiment of the present invention may include the structural units represented by Chemical Formulae 1 to 3, wherein $R_1$ to $R_8$ are independently of one another hydrogen, halogen or a $C_1$ to $C_{10}$ alkyl group, $L_1$ and $L_2$ are a linking group, and independently of each other a direct bond, —C(=O)—O—, a $C_1$ to $C_{10}$ alkylene group, $C_6$ to $C_{20}$ arylene group or a $C_6$ to $C_{20}$ haloarylene group, $R_9$ and $R_{10}$ are independently of each other hydrogen, halogen, a $C_1$ to $C_{10}$ alkyl group, —NCO or -$L_3$—NCO, any one of $R_9$ and $R_{10}$ is —NCO or -$L_3$—NCO, and $L_3$ is a $C_1$ to $C_{10}$ alkylene group.

Specifically, in the structural unit represented by Chemical Formula 1 according to an exemplary embodiment of the present invention, $R_1$ and $R_2$ may be independently of each other hydrogen or a $C_1$ to $C_{10}$ alkyl group, specifically for example, $R_1$ and $R_2$ may be independently of each other hydrogen, methyl, ethyl, propyl, butyl, pentyl, hexyl, heptyl or octyl. Preferably, $R_1$ and $R_2$ may be independently of each other hydrogen or a $C_1$ to $C_5$ alkyl group, specifically for example, $R_1$ and $R_2$ may be independently of each other hydrogen, methyl, ethyl, propyl, butyl or pentyl.

In addition, in the structural unit represented by Chemical Formula 2 according to an exemplary embodiment of the present invention, $R_3$ may be hydrogen or a $C_1$ to $C_{10}$ alkyl group, and $R_4$ to $R_8$ may be independently of one another hydrogen or halogen. Preferably, $R_3$ may be hydrogen or a $C_1$ to $C_5$ alkyl group, and $R_4$ to $R_8$ may be independently of one another hydrogen or halogen.

Specifically for example, $R_3$ may be hydrogen, methyl, ethyl, propyl, butyl, pentyl, hexyl, heptyl or octyl, and $R_4$ to $R_8$ may be independently of one another hydrogen, fluorine (F), chlorine (Cl), bromine (Br) or iodine (I).

As a preferred specific example, $R_3$ may be hydrogen, methyl, ethyl, propyl, butyl or pentyl, and $R_4$ to $R_8$ may be independently of one another hydrogen, fluorine (F), chlorine (Cl), bromine (Br) or iodine (I), More specifically for example, the structural unit represented by Chemical Formula 2 may include any one structural unit selected from the following structural formula, but not limited thereto:

wherein

X is halogen, specifically, fluorine (F), chlorine (Cl), bromine (Br) or iodine (I).

In addition, in the structural unit represented by Chemical Formula 3 of the random copolymer according to a preferred exemplary embodiment of the present invention, $L_1$ may be a direct bond as the linking group, and $L_2$ may be —C(=O)—O— as the linking group. $R_9$ may be hydrogen or a $C_1$ to $C_{10}$ alkyl group, $R_{10}$ may be —NCO or -$L_3$—NCO, and $L_3$ may be $C_1$ to $C_{10}$ alkylene group.

Specifically, $R_9$ may be hydrogen, methyl, ethyl, propyl, butyl, pentyl, hexyl, heptyl or octyl. $L_3$ may be methylene, ethylene, propylene, butylene, pentylene, hexylene, heptylene or octylene. Preferably, $R_9$ may be hydrogen or a $C_1$ to $C_5$ alkyl group, $R_{10}$ may be —NCO or -$L_3$—NCO, and $L_3$ may be $C_1$ to $C_5$ alkylene group. Specifically, $R_9$ may be hydrogen, methyl, ethyl, propyl, butyl or pentyl. $L_3$ may be methylene, ethylene, propylene, butylene or pentylene.

In the structural unit represented by Chemical Formula 3 of the random copolymer according to another preferred exemplary embodiment of the present invention, $L_1$ may be a direct bond as the linking group, and $L_2$ is a $C_6$ to $C_{20}$ arylene group as the linking group, and preferably $L_2$ may be $C_6$ to $C_{15}$ arylene group as the linking group, specifically $L_2$ is phenylene or naphthylene as the linking group.

$R_9$ may be hydrogen or a $C_1$ to $C_{10}$ alkyl group, $R_{10}$ may be —NCO or -$L_3$—NCO, and $L_3$ may be $C_1$ to $C_{10}$ alkylene group. Specifically, $R_9$ may be hydrogen, methyl, ethyl, propyl, butyl, pentyl, hexyl, heptyl or octyl. $L_3$ may be methylene, ethylene, propylene, butylene, pentylene, hexylene, heptylene or octylene.

Preferably, $R_9$ may be hydrogen or a $C_1$ to $C_5$ alkyl group, $R_{10}$ may be —NCO or -$L_3$—NCO, and $L_3$ may be $C_1$ to $C_5$ alkylene group. Specifically, $R_9$ may be hydrogen, methyl, ethyl, propyl, butyl or pentyl. $L_3$ may be methylene, ethylene, propylene, butylene or pentylene.

As the thickness variation value due to washing is significantly lowered by adjusting the content of an isocyanate group (—NCO) of a structural unit represented by Chemical Formula 3, the damage to the neutral layer may be prevented, and it is easy to form a vertical oriented lamellar phase pattern of the block copolymer formed on the neutral layer.

Therefore, the random copolymer according to the present invention may be provided as a new random copolymer for forming a neutral layer by polymerizing the structural unit represented by Chemical Formula 3 with various structural units represented by Chemical Formulae 1 and 2.

According to an exemplary embodiment of the present invention, it is preferred that the mole ratio of each structural unit of the random copolymer is differently adjusted depending on the number of introduced isocyanate groups as described below, in order to effectively form the vertically oriented lamellar phase, and secure a high-quality pattern. In addition, the mole ratios of the structural units of Chemical Formulae 1 and 2 may be differently adjusted depending on the constitution of the structural unit of Chemical Formula 3.

Preferably, Chemical Formulae 1 to 3 which are each randomly arranged structural units have mole fractions defined as m, n and l, respectively in this order, and m, n and l may satisfy $0.2<m<0.9$, $0.2<n<0.9$, and $0<l<0.4$, respectively, based on the total mole fractions of the structural units. More preferably, m, n and l may satisfy $0.3<m<0.9$, $0.3<n<0.9$, and $0<l<0.2$. Here, when the structural unit of the random copolymer is a terpolymer of the structural units represented by Chemical Formulae 1 to 3, m, n and l may satisfy $m+n+l=1$. It is preferred to have the mole ratio as such, since a stable neutral layer which is not affected by a follow-up process may be formed, and a vertically oriented lamellar phase is more effectively derived, thereby forming a fine, high-density and high-quality pattern.

More specifically, according to an exemplary embodiment of the present invention, the random copolymer may include 0.1 to 20 mol %, preferably 1 to 15 mol %, more preferably 2 to 12 mol %, most preferably 4 to 12 mol % of the structural unit represented by Chemical Formula 3, based on total 100 mol % of the random copolymer. It is preferred to include the structural unit within the range, since coating uniformity to a substrate is improved, and a degree of crosslinking is excellent even in the case of short-time heat treatment.

In addition, the neutral layer is stably formed by crosslinking of the isocyanate group of the structural unit represented by Chemical Formula 3, so that it is not adversely affected by intermixing with the layer coated thereon, development, light irradiation, stripping and the like, and may have a thickness variation value before and after washing which is significantly small. Thus, the lamellar phase in which the block copolymer is vertically oriented is almost completely aligned, so that the pattern may be stably formed.

The random copolymer according to an exemplary embodiment of the present invention may have a number average molecular weight of 1,000 to 500,000 g/mol, preferably 1,000 to 100,000 g/mol, but not limited thereto. In addition, the random copolymer may have a polydispersity index of 1.0 to 2.0 preferably 1.0 to 1.5 m but not limited thereto. It is preferred that the random copolymer has the molecular weight and the polydispersity index as described above, since it has excellent solubility to a solvent when forming the neutral layer to improve coating uniformity on the substrate.

The method for preparing the random copolymer of the present invention will be described in detail.

The random copolymer of the present invention may be prepared by polymerizing the compounds represented by the following Chemical Formulae 4 to 6:

[Chemical Formula 4]

[Chemical Formula 5]

[Chemical Formula 6]

wherein $R_1$ to $R_8$ are independently of one another hydrogen, halogen or a $C_1$ to $C_{10}$ hydrocarbyl group, $L_1$ and $L_2$ are a linking group, and independently of each other a direct bond, —C(=O)—O—, a $C_1$ to $C_{20}$ hydrocarbylene group, or a $C_1$ to $C_{20}$ halocarbylene group, $R_9$ and $R_{10}$ are independently of each other hydrogen, halogen, a $C_1$ to $C_{10}$ hydrocarbyl group, —NCO or -$L_3$—NCO, any one of $R_9$ and $R_{10}$ is selected from —NCO or -$L_3$—NCO, and $L_3$ is a $C_1$ to $C_{10}$ hydrocarbylene group.

More preferably, according to an exemplary embodiment of the present invention, in Chemical Formulae 4 to 6, $R_1$ to $R_8$ are independently of one another hydrogen, halogen or a $C_1$ to $C_{10}$ alkyl group, $L_1$ and $L_2$ are a linking group, and a direct bond, —C(=O)—O—, a $C_1$ to $C_{10}$ alkylene group, $C_6$ to $C_{20}$ arylene group or a $C_6$ to $C_{20}$ haloarylene group, $R_9$ and $R_{10}$ are independently of each other hydrogen, halogen, a $C_1$ to $C_{10}$ alkyl group, —NCO or -$L_3$—NCO, any one of $R_9$ and $R_{10}$ is —NCO or -$L_3$—NCO, and $L_3$ is a $C_1$ to $C_{10}$ alkylene group.

More specifically, in the compound represented by Chemical Formula 4 according to an exemplary embodiment of the present invention, $R_1$ and $R_2$ may be independently of each other selected from hydrogen or a $C_1$ to $C_{10}$ alkyl group, and specifically for example, $R_1$ and $R_2$ may be hydrogen, methyl, ethyl, propyl, butyl, pentyl, hexyl, heptyl and octyl.

Preferably, $R_1$ and $R_2$ may be independently of each other hydrogen or a $C_1$ to $C_5$ alkyl group, specifically for example, $R_1$ and $R_2$ may be hydrogen, methyl, ethyl, propyl, butyl or pentyl.

Specifically for example, the compound represented by Chemical Formula 4 may be selected from the group consisting of methyl acrylate, ethyl acrylate, methyl methacrylate, ethyl methacrylate, methyl ethacrylate, ethyl ethacrylate, n-butyl acrylate, isobutyl acrylate, t-butyl acrylate, propyl methacrylate, n-butyl methacrylate, isobutyl methacrylate and t-butyl methacrylate, and the like, but not limited thereto.

In addition, in the compound represented by Chemical Formula 5 according to an exemplary embodiment of the present invention, $R_3$ may be hydrogen or a $C_1$ to $C_{10}$ alkyl group, and $R_4$ to $R_8$ may be independently of one another hydrogen or halogen.

Specifically for example, $R_3$ may be hydrogen, methyl, ethyl, propyl, butyl, pentyl, hexyl, heptyl or octyl, and $R_4$ to $R_8$ may be independently of one another hydrogen, fluorine (F), chlorine (Cl), bromine (Br) or iodine (I), Preferably, $R_3$ may be hydrogen or a $C_1$ to $C_5$ alkyl group, and $R_4$ to $R_8$ may be independently of one another hydrogen or halogen.

Specifically for example, $R_3$ may be hydrogen, methyl, ethyl, propyl, butyl or pentyl, and $R_4$ to $R_8$ may be independently of one another hydrogen, fluorine (F), chlorine (Cl), bromine (Br) or iodine (I).

Specifically for example, the compound represented by Chemical Formula 5 may be selected from the group consisting of styrene, α-methylstyrene, o-methylstyrene, m-methylstyrene, p-methylstyrene, dimethyl styrene, flourostyrene, diflourostyrene, tetraflourostyrene, chlorostyrene, dichlorostyrene, tetrachlorostyrene, bromostyrene, dibromostyrene, tetrabromostyrene, fluorovinylbenzene, chlorovinylbenzene, bromovinylbenzene and iodovinylbenzene, and the like, but not limited thereto.

In addition, in the compound represented by Chemical Formula 6 of the random copolymer according to a preferred exemplary embodiment of the present invention, $L_1$ may be a direct bond as the linking group, and $L_2$ may be —C(=O)—O— as the linking group.

$R_9$ may be hydrogen or a $C_1$ to $C_{10}$ alkyl group, $R_{10}$ may be —NCO or -$L_3$—NCO, and $L_3$ may be $C_1$ to $C_{10}$ alkylene group. Specifically, $R_9$ may be hydrogen, methyl, ethyl, propyl, butyl, pentyl, hexyl, heptyl or octyl. $L_3$ may be methylene, ethylene, propylene, butylene, pentylene, hexylene, heptylene or octylene.

Preferably, $R_9$ may be hydrogen or a $C_1$ to $C_5$ alkyl group, $R_{10}$ may be —NCO or -$L_3$—NCO, and $L_3$ may be $C_1$ to $C_5$ alkylene group. Specifically, $R_9$ may be hydrogen, methyl, ethyl, propyl, butyl or pentyl. $L_3$ may be methylene, ethylene, propylene, butylene or pentylene.

In the compound represented by Chemical Formula 6 of the random copolymer according to another preferred exemplary embodiment of the present invention, $L_1$ may be a direct bond as the linking group, and $L_2$ is a $C_6$ to $C_{20}$ arylene group as the linking group, and preferably $L_2$ may be $C_6$ to $C_{15}$ arylene group as the linking group, specifically $L_2$ is phenylene or naphthylene as the linking group.

$R_9$ may be hydrogen or a $C_1$ to $C_{10}$ alkyl group, $R_{10}$ may be —NCO or -$L_3$—NCO, and $L_3$ may be $C_1$ to $C_{10}$ alkylene group. Specifically, $R_9$ may be hydrogen, methyl, ethyl, propyl, butyl, pentyl, hexyl, heptyl or octyl. $L_3$ may be methylene, ethylene, propylene, butylene, pentylene, hexylene, heptylene or octylene.

Preferably, $R_9$ may be hydrogen or a $C_1$ to $C_5$ alkyl group, $R_{10}$ may be —NCO or -$L_3$—NCO, and $L_3$ may be $C_1$ to $C_5$ alkylene group. Specifically, $R_9$ may be hydrogen, methyl, ethyl, propyl, butyl or pentyl. $L_3$ may be methylene, ethylene, propylene, butylene or pentylene.

As the thickness variation value due to washing is significantly lowered by adjusting the content of an isocyanate group (—NCO) of the compound represented by Chemical Formula 6, the damage to the neutral layer by a follow-up process such as etching may be prevented, and it is easy to form a vertical oriented lamellar phase pattern of the block copolymer formed on the neutral layer. In addition, the compound represented by Chemical Formula 6 according to the present invention may be polymerized with various compounds represented by Chemical Formulae 4 and 5 to prepare a new random copolymer for forming a neutral layer.

Preferably, in the random copolymer of the present invention, when the compound represented by Chemical Formula 4: the compound represented by Chemical Formula 5: the compound represented by Chemical Formula 6 are represented by x:y:z, x, y and z represent the mole ratios of the compounds, respectively, and are rational numbers satisfying $0.2<x<0.9$, $0.2<y<0.9$, $0<z<0.4$. More preferably, they may be rational number satisfying $0.3<x<0.9$, $0.3<y<0.9$, $0<z<0.2$. Here, when the structural unit of the random copolymer is a terpolymer of the structural units represented by Chemical Formulae 1 to 3, x, y and z may satisfy $x+y+z=1$. It is preferred to have the mole ratio as such, since a stable neutral layer which is not affected by a follow-up process may be formed, and a vertically oriented lamellar phase is more effectively derived, thereby forming a fine, high-density and high-quality pattern.

Specifically, according to an exemplary embodiment of the present invention, the random copolymer may include 0.1 to 20 mol %, preferably 1 to 15 mol %, more preferably 2 to 12 mol %, most preferably 4 to 12 mol % of the compound represented by Chemical Formula 6, based on total 100 mol % of the compound forming the random copolymer. Within the range, coating uniformity to a substrate is improved, and crosslinking may occur with short-time heat treatment, thereby shortening a process time. In addition, the neutral layer is stably formed by crosslinking of the isocyanate group even with a small content, so that it is not adversely affected by intermixing, development, light irradiation, stripping and the like with the layer coated thereon, and may have a thickness variation value before and after washing which is significantly small. Thus, with the lamellar phase in which the block copolymer is vertically oriented on the neutral layer, a fine, high-density and high-quality pattern may be formed.

The method for preparing the random copolymer of the present is not particularly limited, however, preferably the random copolymer may be prepared by applying free radical polymerization, living radical polymerization or the like.

The example of the living radical polymerization method may include anion polymerization, atom transfer radical polymerization (ATRP), polymerization by reversible addition-fragmentation chain transfer (RAFT), a method of using an organic tellurium compound as an initiator, or the like, and an appropriate method may be adopted among those methods.

The polymerization of the random copolymer of the present invention may be carried out including a radical initiator and a RAFT reagent, and the radical initiator is not particularly limited, but for example, may be any one or a mixture of two or more selected from the group consisting of an azo-based compound, a peroxide-based compound and the like. Specifically for example, it may be any one or a mixture of two or more selected from the group consisting of azobisisobutyronitrile (AIBN), 1,1-azobis(cyclohexane carbonitrile) (ABCN), benzoylperoxide (BPO), di-t-butyl peroxide (DTBP) and the like.

The RAFT reagent may be specifically for example, any one or a mixture of two or more selected from the group consisting of S-1-dodecyl-S'-($\alpha,\alpha'$-dimethyl-$\alpha''$-acetic acid) trithiocarbonate, cyanoisopropyldithiobenzoate, cumyldithiobenzoate, cumylphenylthioacetate, 1-phenylethyl-1-phenyldithioacetate, 4-cyano-4-(thiobenzoylthio)-N-succinimidebalerate and the like.

According to an exemplary embodiment of the present invention, the radical initiator may be further added in a content of 0.1 to 10 mol %, preferably 0.1 to 5 mol % for deriving uniform polymerization, based on total 100 mol % of the compound forming the random copolymer of the present invention, but not limited thereto. In addition, the RAFT reagent may be further added in a content of 0.1 to 10 mol %, preferably 0.1 to 5 mol %, based on total 100 mol % of the compound forming the random copolymer of the present invention, but not limited thereto.

In the preparation method according to an exemplary embodiment of the present invention, the organic solvent used during polymerization is not limited as long as it is a common organic solvent, however, it may be any one or a mixture of two or more selected from the group consisting of propylene glycol methyl ether acetate (PGMEA), methylene chloride (MC), chlorobenzene, toluene, benzene, chloromethane, chloroform, carbontetrachloride, 1,1-dichloroethane, 1,2-dichloroethane, ethyl chloride, trichloroethane, 1-chloropropane, 2-chloropropane and the like.

In addition, the neutral layer may be formed by dissolving the random copolymer of the present invention in the organic solvent, and then forming a film by a solution process of applying the solution on the substrate, and specifically, formed by applying and coating the solution by any one method selected from the group consisting of spin coating, slot die coating, inkjet printing, screen printing, doctor blade and the like, but not limited thereto.

Another an exemplary embodiment of the present invention is a laminate for forming a pattern including the random copolymer as described above.

Specifically, the laminate for forming a pattern according to an exemplary embodiment of the present invention may be formed on the substrate, and include a neutral layer including the random copolymer as described above.

According to an exemplary embodiment of the present invention, the substrate is for forming the neutral layer thereon, and it is not particularly limited as long as it is commonly used in the art, and the substrate may be in a shape of a wafer or film, and in terms of physical properties, the substrate may be a rigid substrate or a flexible substrate. Specifically for example, the substrate may be selected from the group consisting of a silicon wafer, a silicon oxide substrate, a silicon nitride substrate, a glass substrate, a polymer substrate, and the like, but not limited thereto.

According to an exemplary embodiment of the present invention, the neutral layer formed on the substrate may include the random copolymer as described above, and by including the neutral layer, the block copolymer may be stably vertically oriented on the neutral layer to form a pattern.

According to an exemplary embodiment of the present invention, the thickness of the neutral layer is not particularly limited, but may be 1 to 100 nm, preferably 5 to 60 nm. It is preferred that the neutral layer has the thickness as such, since the surface is uniform, the vertical lamellar phase of the block copolymer is easily derived on the neutral layer, and a high-quality pattern may be formed.

In addition, according to an exemplary embodiment of the present invention, the neutral layer may have the thickness variation value due to washing satisfying the following Equation 1:

$$\left|\frac{T_0 - T_1}{T_0}\right| < 0.08 \qquad \text{[Equation 1]}$$

wherein $T_0$ is a thickness of the neutral layer before washing, and $T_1$ is a thickness of the neutral layer after washing.

Preferably, in order to form a high-quality, precise, vertically oriented lamellar phase, the thickness variation value may be 0.06 or less, more preferably 0.05 or less, most preferably 0.02 or less. It is more preferred that the lower limit of the thickness variation value includes for example, 0, so that there is no thickness change. Specifically, the thickness variation value may be preferably 0.001 to 0.06, more preferably 0.001 to 0.05, most preferably 0.001 to 0.02.

The washing in the present invention may be performed using any one or a mixture of two or more selected from an organic solvent such as propylene glycol methyl ether acetate (PGMEA), propylene glycol methyl ether (PGME), ethyl lactate (EL), toluene, and the like, or an alkaline solvent such as tetramethylammonium hydroxide (TMAH) and the like. Preferably, toluene may be used, but not limited thereto.

The neutral layer of the present invention as such has a small thickness variation value due to washing, and thus, is not adversely affected by intermixing with the coated layer on the neutral layer, development, light irradiation, stripping and the like, and may be stably formed. Thus, the change in the neutral layer or etching selectivity is not affected even by a follow-up process such as etching, and the lamellar phase in which the block copolymer is vertically oriented may be stably formed on the neutral layer, which is preferred.

The method for forming a pattern according to an exemplary embodiment of the present invention may use the random copolymer as described above with a block copolymer.

Specifically, the method for forming a pattern according to an exemplary embodiment of the present invention may include:

a) applying a random copolymer solution including the random copolymer on a substrate, b) subjecting the applied random copolymer solution to heat treatment to form a neutral layer, c) applying a block copolymer solution including the block copolymer on the neutral layer, and d) subjecting the applied block copolymer solution to heat treatment to form a pattern.

According to an exemplary embodiment of the present invention, in step a), the random copolymer solution may be provided by including the random copolymer of the present invention and an organic solvent.

According to an exemplary embodiment of the present invention, the organic solvent in the random copolymer solution may be any one or a mixture thereof selected from the group consisting of propylene glycol methyl ether acetate (PGMEA), methylene chloride (MC), chlorobenzene, toluene, benzene, chloromethane, chloroform, carbontetrachloride, 1,1-dichloroethane, 1,2-dichloroethane, ethyl chloride, trichloroethane, 1-chloropropane, 2-chloropropane and the like.

According to an exemplary embodiment, in step a), the random copolymer solution may have a concentration of 0.1 to 5 wt %, preferably 0.2 to 3 wt %. Specifically, the random copolymer solution may include 0.1 to 5 wt % of the random copolymer and 95 to 99.9 wt % of the solvent, and preferably 0.2 to 3 wt % of the random copolymer and 97 to 99.8 wt % of the solvent. It is preferred that the random copolymer solution is used within the range, since the solution may be evenly applied on the substrate, and form a stable neutral layer having a small thickness variation value due to washing even in the case of short-time heat treatment.

In addition, according to an exemplary embodiment of the present invention, the neutral layer may be formed by a process of applying the random copolymer solution on the substrate, specifically by applying and coating the solution by any one method selected from the group consisting of spin coating, slot die coating, inkjet printing, screen printing, doctor blade and the like, but not limited thereto.

According to an exemplary embodiment, in step b), the heat treatment may be performed at 230 to 300° C., preferably 240 to 280° C. The temperature as such is preferred, since excellent binding force with the substrate at the time of heat treatment may be possessed, the chemical crosslinking reaction between the random copolymers may be derived in the neutral layer.

According to an exemplary embodiment, in step b), the heat treatment may be performed for 30 seconds to 50 minutes, preferably 1 minute to 30 minutes. More preferably, even when the heat treatment for forming the neutral layer may be performed for 1 minute to 15 minutes, an excellent degree of crosslinking may occur. Even in the case of short-time heat treatment as such, the random copolymer of the present invention has an excellent chemical crosslinking reaction, and thus, the neutral layer has no influence on the thickness change or etching selectivity even after a follow-up process, and a pattern of a vertical lamellar phase may be stably formed, which is preferred.

According to an exemplary embodiment, in step b), the formed neutral layer may have a thickness variation value due to washing, satisfying the following Equation 1:

$$\left| \frac{T_0 - T_1}{T_0} \right| < 0.08 \quad \text{[Equation 1]}$$

wherein $T_0$ is a thickness of the neutral layer before washing, and $T_1$ is a thickness of the neutral layer after washing.

Preferably, in order to form a high-quality, precise, vertically oriented lamellar phase, the thickness variation value may be 0.06 or less, more preferably 0.05 or less, most preferably 0.02 or less.

The neutral layer of the present invention as such has a small thickness variation value due to washing, and thus, may be stably formed without being adversely affected by intermixing with the coated layer on the neutral layer, development, light irradiation, stripping and the like, and may be stably formed. In addition, since the change in the neutral layer or etching selectivity is not affected even by a follow-up process such as etching, the lamellar phase in which the block copolymer is vertically oriented may be stably formed on the neutral layer to form a fine and precise pattern.

According to an exemplary embodiment of the present invention, the block copolymer in step c) is not particularly limited, however, specifically for example, any one or a mixture of two or more selected from the group consisting of polystyrene-b-polymethylmethacrylate, polybutadiene-b-polybutylmethacrylate, polybutadiene-b-polydimethylsiloxane, polybutadiene-b-polymethylmethacrylate, polybutadiene-b-polyvinylpyridine, polybutylacrylate-b-polymethylmethacrylate, polybutylacrylate-b-polyvinylpyridine, polyisoprene-b-polyvinylpyridine, polyisoprene-b-polymethylmethacrylate, polyhexylacrylate-b-polyvinylpyridine, polyisobutylene-b-polybutylmethacrylate, polyisobutylene-b-polymethylmethacrylate, polyisobutylene-b-polydimethylsiloxane, polybutylmethacrylate-b-polybutylacrylate, polyethylethylene-b-polymethylmethacrylate, polystyrene-b-polybutylmethacrylate, polystyrene-b-polybutadiene, polystyrene-b-polyisoprene, polystyrene-b-polydimethylsiloxane, polystyrene-b-polyvinylpyridine, polyethylethylene-b-polyvinylpyridine, polyethylene-b-polyvinylpyridine, polyvinylpyridine-b-polymethylmethacrylate, polyethyleneoxide-b-polyisoprene, polyethyleneoxide-b-polybutadiene, polyethyleneoxide-b-polystyrene, polyethyleneoxide-b-polymethylmethacrylate, polyethyleneoxide-b-polydimethylsiloxane, polystyrene-b-polyethyleneoxide, polystyrene-b-polymethylmethacrylate-b-polystyrene, polybutadiene-b-polybutylmethacrylate-b-polybutadiene, polybutadiene-b-polydimethylsiloxane-b-polybutadiene, polybutadiene-b-polymethylmethacrylate-b-polybutadiene polybutadiene-b-polyvinylpyridine-b-polybutadiene, polybutylacrylate-b-polymethylmethacrylate-b-polybutylacrylate, polybutylacrylate-b-polyvinylpyridine-b-polybutylacrylate, polyisoprene-b-polyvinylpyridine-b-polyisoprene, polyisoprene-b-polymethylmethacrylate-b-polyisoprene, polyhexylacrylate-b-polyvinylpyridine-b-polyhexylacrylate, polyisobutylene-b-polybutylmethacrylate-b-polyisobutylene, polyisobutylene-b-polymethylmethacrylate-b-polyisobutylene, polyisobutylene-b-polydimethylsiloxane-b-polyisobutylene, polybutylmethacrylate-b-polybutylacrylate-b-polybutylmethacrylate, polyethylethylene-b-polymethylmethacrylate-b-polyethylethylene, polystyrene-b-polybutylmethacrylate-b-polystyrene, polystyrene-b-polybutadiene-b-polystyrene, polystyrene-b-polyisoprene-b-polystyrene, polystyrene-b-polydimethylsiloxane-b-polystyrene, polystyrene-b-polyvinylpyridine-b-polystyrene, polyethylethylene-b-polyvinylpyridine-b-polyethylethylene, polyethylene-b-polyvinylpyridine-b-polyethylene, polyvinylpyridine-b-polymethylmethacrylate-b-polyvinylpyridine, polyethyleneoxide-b-polyisoprene-b- polyethyleneoxide, polyethyleneoxide-b-polybutadiene-b-polyethyleneoxide, polyethyleneoxide-b-polystyrene-b-polyethyleneoxide, polyethyleneoxide-b-polymethylmethacrylate-b-polyethyleneoxide, polyethyleneoxide-b-polydimethylsiloxane-b-polyethyleneoxide, polystyrene-b-polyethyleneoxide-b-polystyrene, and the like, but not particularly limited thereto.

According to an exemplary embodiment of the present invention, in step c), the random copolymer solution may be provided by including the block copolymer of the present invention and an organic solvent.

According to an exemplary embodiment of the present invention, the organic solvent in the block copolymer solution may be any one or a mixture thereof selected from the group consisting of propylene glycol methyl ether acetate (PGMEA), methylene chloride (MC), chlorobenzene, toluene, benzene, chloromethane, chloroform, carbontetrachloride, 1,1-dichloroethane, 1,2-dichloroethane, ethyl chloride, trichloroethane, 1-chloropropane, 2-chloropropane and the like.

According to an exemplary embodiment, in step c), the block copolymer solution may have a concentration of 0.1 to 5 wt %, preferably 0.2 to 3 wt %. Specifically, the block copolymer solution may include 0.1 to 5 wt % of the random copolymer and 95 to 99.9 wt % of the solvent, and preferably 0.2 to 3 wt % of the block copolymer and 97 to 99.8 wt % of the solvent. It is preferred to use the block copolymer solution within the range, since the block copolymer may be vertically oriented by a short-time self-assembly process.

Next, according to an exemplary embodiment of the present invention, in step d), the heat treatment is not particularly limited as long as it is performed under the condition that the block copolymer may be spontaneously self-assembled, however, the heat treatment may be performed by heating the block copolymer to a glass transition temperature thereof or higher to align the block copolymer. Specifically for example, the heat treatment may be performed at a temperature of 150 to 300° C. for 1 minute to 24 hours. Within this range, the block copolymer may effectively form a pattern having a vertically oriented lamellar structure. In terms of forming a more highly aligned lamellar pattern, the heat treatment may be performed at a temperature of 200 to 250° C. for 3 minutes to 12 hours.

According to an exemplary embodiment of the present invention, after heat treatment in step d), a step of partially etching the block copolymer may be further included. The etching step may be performed by wet etching, dry etching, or a combination thereof, but in terms of forming a high-quality fine pattern, it is preferred to perform it by dry etching.

Hereinafter, the method for forming a fine pattern according to the present invention will be described in more detail by the following Examples. However, the following Examples are only a reference for describing the present invention in detail, and the present invention is not limited thereto, and may be implemented in various forms.

In addition, unless otherwise defined, all technical terms and scientific terms have the same meanings as those commonly understood by a person skilled in the art to which the present invention pertains, the terms used herein is only for effectively describing a certain exemplary embodiment, and not intended to limit the present invention. Further, unless otherwise stated, the unit of added materials herein may be wt %.

EXAMPLE 1

AIBN (azobisisobutyronitrile), cyanoisopropyl dithiobenzoate, methyl methacrylate, styrene, and 2-isocyanatoethyl methacrylate were dissolved at a concentration of 50 wt % in benzene, at a mole ratio of 1:5:550:420:30. Thereafter, the reaction was performed at 80° C. for 18 hours under nitrogen atmosphere to synthesize a random copolymer having an isocyanate content of 3 mol %, a number average molecular weight of 15,700 g/mol, and a molecular weight distribution of 1.18.

EXAMPLE 2

A random copolymer having an isocyanate content of 5 mol %, a number average molecular weight of 15,700 g/mol, and a molecular weight distribution of 1.18 was synthesized in the same manner as in Example 1, except that the mole ratio of methyl methacrylate, styrene and 2-isocyanatoethyl methacrylate was changed into 530:420:50.

EXAMPLE 3

A random copolymer having an isocyanate content of 10 mol %, a number average molecular weight of 15,700 g/mol, and a molecular weight distribution of 1.19 was synthesized in the same manner as in Example 1, except that the mole ratio of methyl methacrylate, styrene and 2-isocyanatoethyl methacrylate was changed into 480:420:100.

EXAMPLE 4

A random copolymer having an isocyanate content of 10 mol %, a number average molecular weight of 15,800 g/mol, and a molecular weight distribution of 1.17 was synthesized in the same manner as in Example 1, except that the mole ratio of methyl methacrylate, styrene and methyl 2-isocyanatoacrylate was changed into 480:420:100.

EXAMPLE 5

A random copolymer having an isocyanate content of 10 mol %, a number average molecular weight of 15,800 g/mol, and a molecular weight distribution of 1.17 was synthesized in the same manner as in Example 1, except that the mole ratio of methyl methacrylate, styrene and 1-isocyanato-4-vinylbenzene was changed into 480:420:100.

EXAMPLE 6

A random copolymer having an isocyanate content of 15 mol %, a number average molecular weight of 14,700 g/mol, and a molecular weight distribution of 1.20 was synthesized in the same manner as in Example 1, except that the mole ratio of methyl methacrylate, styrene and 2-isocyanatoethyl methacrylate was changed into 430:420:150.

COMPARATIVE EXAMPLE 1

AIBN (azobisisobutyronitrile), a RAFT reagent (cyanoisopropyl dithiobenzoate), methyl methacrylate, and styrene, were dissolved at a concentration of 50 wt % in benzene, at a mole ratio of 1:5:500:500. Thereafter, the reaction was performed at 80° C. for 18 hours under nitrogen atmosphere to synthesize a random copolymer having a number average molecular weight of 14,400 g/mol, and a molecular weight distribution of 1.21.

COMPARATIVE EXAMPLE 2

AIBN (azobisisobutyronitrile), a RAFT reagent (cyanoisopropyl dithiobenzoate), methyl methacrylate, styrene, and glycidyl methacrylate were dissolved at a concentration of wt % in benzene, at a mole ratio of 1:5:480:420:100. Thereafter, the reaction was performed at 80° C. for 18 hours under nitrogen atmosphere to synthesize a random copolymer having a number average molecular weight of 15,400 g/mol, and a molecular weight distribution of 1.23.

COMPARATIVE EXAMPLE 3

AIBN (azobisisobutyronitrile), a RAFT reagent (cyanoisopropyl dithiobenzoate), methyl methacrylate, styrene, and 2-hydroxyethyl methacrylate were dissolved at a concentration of 50 wt % in benzene, at a mole ratio of 1:5:480:420:100. Thereafter, the reaction was performed at 80° C. for 18 hours under nitrogen atmosphere to synthesize a random copolymer having a number average molecular weight of 14,000 g/mol, and a molecular weight distribution of 1.24.

EVALUATION EXAMPLE 1

The random copolymers prepared in Examples 1 to 6, and Comparative Examples 1 to 3 were dissolved in PGMEA (propylene glycol methyl ether acetate) at 2 wt % or 0.4 wt %, and then the random copolymer solutions were applied on a SiO$_2$ substrate by spin coating, and subjected to heat treatment under the different temperature and time conditions as shown in the following Table 1 in the nitrogen state to form neutral layers. After the heat treatment, the neutral layers were washed with toluene, and the thickness thereof was measured using ellipsometry and shown in Table 1.

TABLE 1

| | Random copolymer solution concentration (wt %) | Heat treatment temperature (° C.) | Heat treatment time (min) | Thickness (nm) After coating/before washing | After washing | Thickness variation value |
|---|---|---|---|---|---|---|
| Example 1 | 0.4 | 250 | 2 | 10.5 | 10.1 | 0.038 |
| | | | 5 | 10.5 | 10.1 | 0.038 |
| | | | 10 | 10.5 | 10.2 | 0.028 |
| | | | 30 | 10.5 | 10.3 | 0.019 |
| | | 270 | 2 | 10.5 | 10.2 | 0.028 |
| | | | 5 | 10.5 | 10.3 | 0.019 |
| | | | 10 | 10.5 | 10.4 | 0.009 |
| | | | 30 | 10.5 | 10.4 | 0.009 |
| | 2 | 250 | 2 | 51.6 | 49.2 | 0.046 |
| | | | 5 | 51.6 | 49.4 | 0.042 |
| | | | 10 | 51.6 | 49.3 | 0.044 |
| | | | 30 | 51.6 | 49.8 | 0.034 |
| | | 270 | 2 | 51.6 | 49.3 | 0.044 |
| | | | 5 | 51.6 | 49.8 | 0.034 |
| | | | 10 | 51.6 | 49.8 | 0.034 |
| | | | 30 | 51.6 | 50.0 | 0.031 |
| Example 2 | 0.4 | 250 | 2 | 11.4 | 11.4 | 0 |
| | | | 5 | 11.4 | 11.3 | 0.008 |
| | | | 10 | 11.4 | 11.3 | 0.008 |
| | | | 30 | 11.4 | 11.2 | 0.017 |
| | | 270 | 2 | 11.4 | 11.3 | 0.008 |
| | | | 5 | 11.4 | 11.3 | 0.008 |
| | | | 10 | 11.4 | 11.2 | 0.017 |
| | | | 30 | 11.4 | 11.3 | 0.008 |
| | 2 | 250 | 2 | 52.3 | 52.2 | 0.001 |
| | | | 5 | 52.3 | 52.2 | 0.001 |
| | | | 10 | 52.3 | 52.3 | 0 |
| | | | 30 | 52.3 | 52.3 | 0 |
| | | 270 | 2 | 52.3 | 52.2 | 0.001 |
| | | | 5 | 52.3 | 52.2 | 0.001 |
| | | | 10 | 52.3 | 52.2 | 0.001 |
| | | | 30 | 52.3 | 52.3 | 0 |
| Example 3 | 0.4 | 250 | 2 | 10.6 | 10.5 | 0.009 |
| | | | 5 | 10.6 | 10.6 | 0 |
| | | | 10 | 10.6 | 10.5 | 0.009 |
| | | | 30 | 10.6 | 10.6 | 0 |
| | | 270 | 2 | 10.6 | 10.6 | 0 |
| | | | 5 | 10.6 | 10.5 | 0.009 |
| | | | 10 | 10.6 | 10.5 | 0.009 |
| | | | 30 | 10.6 | 10.5 | 0.009 |
| | 2 | 250 | 2 | 53.0 | 52.9 | 0.001 |
| | | | 5 | 53.0 | 53.0 | 0 |
| | | | 10 | 53.0 | 52.8 | 0.003 |
| | | | 30 | 53.0 | 52.9 | 0.001 |
| | | 270 | 2 | 53.0 | 52.8 | 0.003 |
| | | | 5 | 53.0 | 52.9 | 0.001 |
| | | | 10 | 53.0 | 52.9 | 0.001 |
| | | | 30 | 53.0 | 53.0 | 0 |
| Example 4 | 0.4 | 250 | 2 | 10.9 | 10.1 | 0.073 |
| | | | 5 | 10.9 | 10.3 | 0.055 |
| | | | 10 | 10.9 | 10.2 | 0.066 |
| | | | 30 | 10.9 | 10.4 | 0.045 |

TABLE 1-continued

| | Random copolymer solution concentration (wt %) | Heat treatment temperature (° C.) | Heat treatment time (min) | Thickness (nm) After coating/before washing | After washing | Thickness variation value |
|---|---|---|---|---|---|---|
| | | 270 | 2 | 10.9 | 10.3 | 0.055 |
| | | | 5 | 10.9 | 10.2 | 0.066 |
| | | | 10 | 10.9 | 10.3 | 0.055 |
| | | | 30 | 10.9 | 10.4 | 0.045 |
| | 2 | 250 | 2 | 52.3 | 48.7 | 0.068 |
| | | | 5 | 52.3 | 49.4 | 0.055 |
| | | | 10 | 52.3 | 49.3 | 0.057 |
| | | | 30 | 52.3 | 49.4 | 0.055 |
| | | 270 | 2 | 52.3 | 49.0 | 0.063 |
| | | | 5 | 52.3 | 49.3 | 0.057 |
| | | | 10 | 52.3 | 49.3 | 0.057 |
| | | | 30 | 52.3 | 49.4 | 0.055 |
| Example 5 | 0.4 | 250 | 2 | 11.1 | 10.3 | 0.072 |
| | | | 5 | 11.1 | 10.5 | 0.054 |
| | | | 10 | 11.1 | 10.4 | 0.063 |
| | | | 30 | 11.1 | 10.5 | 0.054 |
| | | 270 | 2 | 11.1 | 10.4 | 0.063 |
| | | | 5 | 11.1 | 10.3 | 0.072 |
| | | | 10 | 11.1 | 10.5 | 0.054 |
| | | | 30 | 11.1 | 10.5 | 0.054 |
| | 2 | 250 | 2 | 50.8 | 47.4 | 0.066 |
| | | | 5 | 50.8 | 47.8 | 0.059 |
| | | | 10 | 50.8 | 48.1 | 0.053 |
| | | | 30 | 50.8 | 48.0 | 0.055 |
| | | 270 | 2 | 50.8 | 46.9 | 0.076 |
| | | | 5 | 50.8 | 47.8 | 0.059 |
| | | | 10 | 50.8 | 47.8 | 0.059 |
| | | | 30 | 50.8 | 48.1 | 0.053 |
| Example 6 | 0.4 | 250 | 2 | 10.8 | 10.3 | 0.046 |
| | | | 5 | 10.8 | 10.4 | 0.037 |
| | | | 10 | 10.8 | 10.6 | 0.018 |
| | | | 30 | 10.8 | 10.6 | 0.018 |
| | | 270 | 2 | 10.8 | 10.4 | 0.037 |
| | | | 5 | 10.8 | 10.5 | 0.027 |
| | | | 10 | 10.8 | 10.5 | 0.027 |
| | | | 30 | 10.8 | 10.6 | 0.018 |
| | 2 | 250 | 2 | 51.1 | 48.6 | 0.048 |
| | | | 5 | 51.1 | 48.9 | 0.043 |
| | | | 10 | 51.1 | 49.2 | 0.037 |
| | | | 30 | 51.1 | 49.6 | 0.029 |
| | | 270 | 2 | 51.1 | 48.8 | 0.045 |
| | | | 5 | 51.1 | 48.9 | 0.043 |
| | | | 10 | 51.1 | 49.4 | 0.033 |
| | | | 30 | 51.1 | 49.8 | 0.025 |
| Comparative Example 1 | 0.4 | 250 | 2 | 9.8 | 5.1 | 0.479 |
| | | | 10 | 9.8 | 5.5 | 0.438 |
| | | | 30 | 9.8 | 5.4 | 0.448 |
| | | 270 | 2 | 9.8 | 5.2 | 0.469 |
| | | | 10 | 9.8 | 5.2 | 0.469 |
| | | | 30 | 9.8 | 5.5 | 0.438 |
| Comparative Example 2 | 0.4 | 250 | 2 | 10.7 | 6.9 | 0.316 |
| | | | 10 | 10.7 | 7.0 | 0.306 |
| | | | 30 | 10.7 | 7.0 | 0.297 |
| | | 270 | 2 | 10.7 | 7.1 | 0.287 |
| | | | 10 | 10.7 | 7.2 | 0.297 |
| | | | 30 | 10.7 | 7.1 | 0.277 |
| Comparative Example 3 | 0.4 | 250 | 2 | 10.1 | 5.9 | 0.415 |
| | | | 10 | 10.1 | 6.0 | 0.406 |
| | | | 30 | 10.1 | 6.1 | 0.397 |
| | | 270 | 2 | 10.1 | 6.2 | 0.386 |
| | | | 10 | 10.1 | 6.1 | 0.397 |
| | | | 30 | 10.1 | 6.3 | 0.376 |

As shown in Table 1, it is recognized that there was almost no change in thickness of the thin film of the random copolymer which was subject to heat treatment after applying the random copolymer of the present invention. This means that sufficient crosslinking was performed even within a short time due to the isocyanate group in the random copolymer of the present invention. Through this, the neutral layer formation process time may be shortened. On the neutral layer of the present invention formed as such, the block copolymer was used to effectively form a vertically oriented lamellar phase, which is not affected by follow-up processes, thereby stably forming a pattern.

In particular, in Examples 1, 2, 3 and 6, the thickness variation value due to washing was significantly reduced as compared with the Comparative Examples, and thus, it was confirmed that when coating the block copolymer on the neutral layer to form a thin film, a pattern was stably formed. In Example 1, as the content of the isocyanate group in the random copolymer was somewhat low, a degree of cross-linking was resultingly somewhat decreased, and in Example 6, as the content of the isocyanate group in the random copolymer was increased, stiffness was rather increased, thereby resulting in a decrease in the stability of the neutral layer. Preferably, further in Examples 2 and 3, there was almost no change in thickness due to washing, as compared with the Comparative Examples, and thus, it was confirmed that when coating the block copolymer on the neutral layers of Examples 2 and 3 to form a thin film, a fine and precise, high-quality pattern may be formed.

In addition, when using the random copolymer which does not include the isocyanate group as in Comparative Examples 1, 2 and 3, a crosslinking property was deteriorated within a short time to rapidly change the thickness variation due to washing, and the neutral effect was decreased, and thus, it was not easy to form a vertically oriented lamellar phase using the block copolymer.

EVALUATION EXAMPLE 2

A random copolymer solution of the random copolymer prepared in Example 1 dissolved in propylene glycol methyl ether acetate (PGMEA) at 0.4 wt % was applied on a $SiO_2$ substrate by spin coating, and subjected to heat crosslinking treatment at 250° C. for 2 minutes in the nitrogen state, thereby forming a neutral layer. Next, the block copolymer which was PS-b-PMMA having a number average molecular weight of 94 kg/mol and a ratio of PS:PMMA=48:46 was dissolved in propylene glycol methyl ether acetate (PGMEA), and then the solution was applied on the neutral layer, and subjected to heat treatment at 230° C. for 2 hours in a vacuum.

Figure 1A:
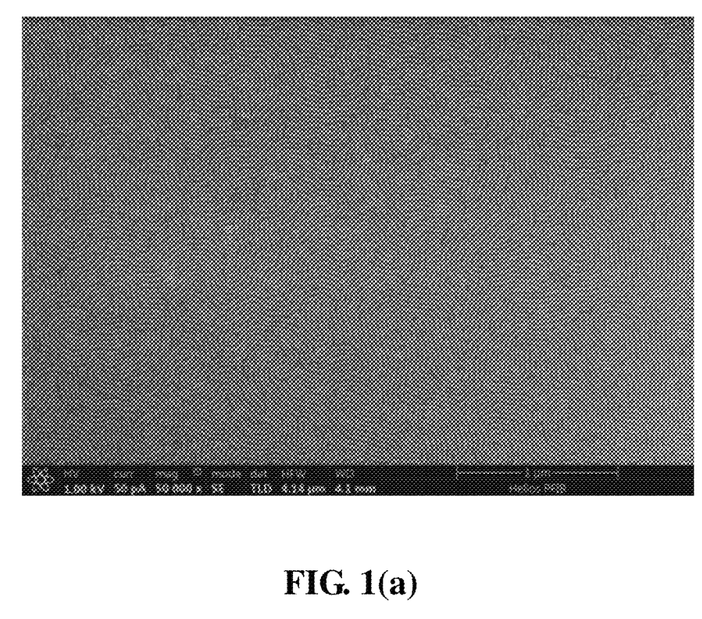
FIGS. 1(a) and 1(b) are photographs of a pattern observed by a scanning electron microscope, after forming the pattern using the random copolymer according to an exemplary embodiment of the present invention.
Figure 1B:
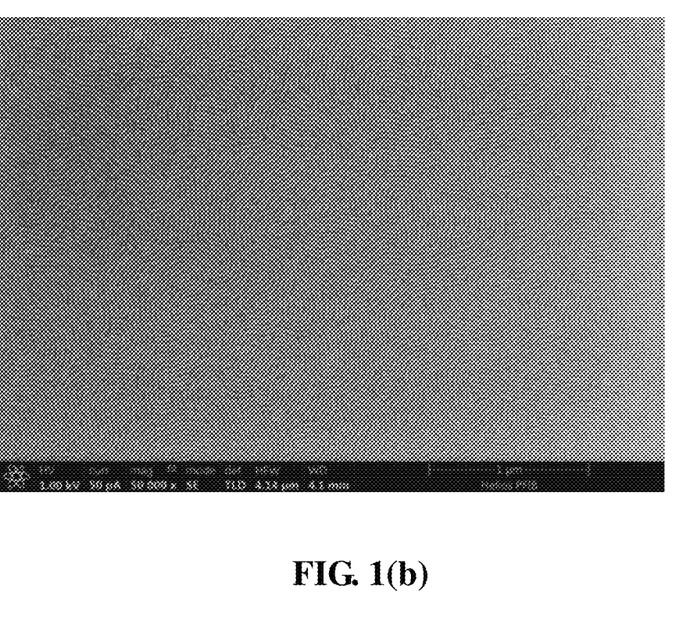

The photographs thereof taken by a scanning electron microscope (SEM, Hitachi—s4800) are shown in FIG. 1. Based on the neutral treatment of the surface, it was confirmed that the block copolymer formed a fine, high-quality and high-density vertical lamellar phase.

In addition, even in the case of using the block copolymer as synthesized as described below, identically based on the neutral treatment of the surface, it was confirmed from FIG. 2 that the block copolymer formed a fine, high-quality and high-density vertical lamellar phase pattern.

The block copolymer was prepared by dissolving AIBN (Azobisisobutyronitrile), cyanoisopropyl dithiobenzoate and methylmethacrylate at a concentration of 50 wt % in benzene at a mole ratio of 1:5:2800. Thereafter, the reaction was performed at 80° C. for 6 hours under nitrogen atmosphere to synthesize a macroinitiator having a number average molecular weight of 45,400 g/mol, and a molecular weight distribution of 1.2. Thereafter, the macroinitiator, AIBN, styrene and pentafluorostyrene were dissolved at a concentration of 60 wt % in dioxane at a mole ratio of 1:0.2:900:100, and the reaction was performed at 70° C. for 24 hours under nitrogen atmosphere, thereby synthesizing a block copolymer having a number average molecular weight of 95,200 g/mol and a molecular weight distribution of 1.2.

Therefore, when deriving a self-arrangement of the block copolymer on the neutral layer including the random copolymer of the present invention to form a pattern, the vertical oriented lamellar phase may be formed into a stable and high-quality pattern.

The random copolymer for forming a neutral layer according to the present invention may significantly reduce process time and process costs, and promote vertical orientation-directed self-assembly pattern formation.

The laminate for forming a pattern according to the present invention includes a neutral layer including the random copolymer of the present invention, thereby having a small thickness variation value due to washing, which results in stably forming a completely aligned, high-quality pattern with the self-assembled block copolymer on the neutral layer.

The method for forming a pattern according to the present invention may form a lamellar phase in which a block copolymer is stably vertically oriented on the laminate for forming a neutralized pattern.

Hereinabove, although the present invention has been described by the specific matters and specific exemplary embodiments, they have been provided only for assisting in the entire understanding of the present invention. Therefore, the present invention is not limited to the exemplary embodiments. Various modifications and changes may be made by those skilled in the art to which the present invention pertains from this description.

Therefore, the spirit of the present invention should not be limited to the above-described exemplary embodiments, and the following claims as well as all modified equally or equivalently to the claims are intended to fall within the scope and spirit of the invention.

What is claimed is:
1. A laminate comprising:
a substrate;
a neutral layer formed on the substrate and including a random copolymer comprising structural units represented by the following Chemical Formulae 1 to 3:

[Chemical Formula 1]

[Chemical Formula 2]

[Chemical Formula 3]

wherein
$R_1$ to $R_8$ are independently of one another hydrogen, halogen or a $C_1$ to $C_{10}$ hydrocarbyl group, $L_1$ and $L_2$ are a linking group, and independently of each other a direct bond, —C(=O)—O—, a $C_1$ to $C_{20}$ hydrocarbylene group, or a $C_1$ to $C_{20}$ halocarbylene group, $R_9$ and $R_{10}$ are independently of each other hydrogen, halogen, a $C_1$ to $C_{10}$ hydrocarbyl group, —NCO or -$L_3$—NCO, any one of $R_9$ and $R_{10}$ is —NCO or -$L_3$—NCO, $L_3$ is a $C_1$ to $C_{10}$ hydrocarbylene group, and Chemical Formulae 1 to 3 which are each randomly arranged structural units have mole ratios defined as m, n and l, respectively in this order, and m, n and l are rational numbers satisfying $0.2<m<0.9$, $0.2<n<0.9$, and $0<l<0.4$, respectively, and a vertical oriented lamellar phase pattern of a block copolymer formed on the neutral layer.

2. The laminate of claim 1, wherein in Chemical Formulae 1 to 3, $R_1$ to $R_8$ are independently of one another hydrogen, halogen or a $C_1$ to $C_{10}$ alkyl group, $L_1$ and $L_2$ are a linking group, and independently of each other a direct bond, —C(=O)—O—, a $C_1$ to $C_{10}$ alkylene group, $C_6$ to $C_{20}$ arylene group or a $C_6$ to $C_{20}$ haloarylene group, $R_9$ and $R_{10}$ are independently of each other hydrogen, halogen, a $C_1$ to $C_{10}$ alkyl group, —NCO or -$L_3$—NCO, any one of $R_9$ and $R_{10}$ is —NCO or -$L_3$—NCO, and $L_3$ is a $C_1$ to $C_{10}$ alkylene group.

3. The laminate of claim 1, wherein in Chemical Formula 3, $L_1$ is a direct bond as the linking group, and $L_2$ is —C(=O)—O— as the linking group, and $R_9$ is hydrogen or a $C_1$ to $C_{10}$ alkyl group, $R_{10}$ is —NCO or -$L_3$—NCO, and $L_3$ is a $C_1$ to $C_{10}$ alkylene group.

4. The laminate of claim 1, wherein in Chemical Formula 3, $L_1$ is a direct bond as the linking group, and $L_2$ is a $C_6$ to $C_{20}$ arylene group as the linking group, and $R_9$ is hydrogen or a $C_1$ to $C_{10}$ alkyl group, $R_{10}$ is —NCO or -$L_3$—NCO, and $L_3$ is a $C_1$ to $C_{10}$ alkylene group.

5. The laminate of claim 1, wherein in Chemical Formulae 1 and 2, $R_1$ and $R_3$ are independently of each other hydrogen or a $C_1$ to $C_{10}$ alkyl group, $R_2$ is a $C_1$ to $C_{10}$ alkyl group, and $R_4$ to $R_8$ are independently of one another hydrogen or halogen.

6. The laminate of claim 1, wherein in Chemical Formula 3, $L_1$ is a direct bond as the linking group, and $L_2$ is —C(=O)—O— as the linking group, and $R_9$ is hydrogen or a $C_1$ to $C_5$ alkyl group, $R_{10}$ is —NCO or -$L_3$—NCO, and $L_3$ is a $C_1$ to $C_5$ alkylene group.

7. The laminate of claim 1, wherein in Chemical Formula 3, $L_1$ is a direct bond as the linking group, and $L_2$ is a $C_6$ to $C_{15}$ arylene group as the linking group, and $R_9$ is hydrogen or a $C_1$ to $C_5$ alkyl group, $R_{10}$ is —NCO or -$L_3$—NCO, and $L_3$ is a $C_1$ to $C_5$ alkylene group.

8. The laminate of claim 1, wherein in Chemical Formulae 1 and 2, $R_1$ and $R_3$ are independently of each other hydrogen or a $C_1$ to $C_5$ alkyl group, $R_2$ is a $C_1$ to $C_5$ alkyl group, and $R_4$ to $R_8$ are independently of one another hydrogen or halogen.

9. The laminate of claim 1, wherein the random copolymer includes 0.1 to 20 mol % of a monomer of the structural unit represented by Chemical Formula 3, based on total 100 mol % of the monomers forming the random copolymer.

10. The laminate of claim 1, wherein the random copolymer has a number average molecular weight of 1,000 to 500,000 g/mol, and a polydispersity index of 1.0 to 2.0.

* * * * *